(12) United States Patent
Kayanuma et al.

(10) Patent No.: US 6,980,250 B1
(45) Date of Patent: Dec. 27, 2005

(54) SOLID STATE IMAGING DEVICE FOR REDUCING CAMERA SIZE

(75) Inventors: Yasunobu Kayanuma, Asaka (JP); Kazukiyo Tamada, Asaka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/408,071

(22) Filed: Sep. 29, 1999

(30) Foreign Application Priority Data

Sep. 29, 1998 (JP) .................................. 10-275894

(51) Int. Cl.[7] .......................................... H04N 5/225
(52) U.S. Cl. ...................... 348/342; 348/340; 348/374
(58) Field of Search ................................ 348/373, 374, 348/375, 340, 342, 335; 438/64, 65, 66, 67, 438/116; 257/433, 434, 680

(56) References Cited

U.S. PATENT DOCUMENTS

| | | | | |
|---|---|---|---|---|
| 4,896,217 A | * | 1/1990 | Miyazawa et al. | 348/340 |
| 4,930,861 A | * | 6/1990 | Okabe et al. | 385/117 |
| 5,461,418 A | * | 10/1995 | Shiraishi | 348/291 |
| 5,467,224 A | * | 11/1995 | Ohnishi et al. | 359/614 |
| 5,724,152 A | * | 3/1998 | Hayashi et al. | 358/296 |
| 5,777,675 A | * | 7/1998 | Miida et al. | 348/350 |
| 5,821,532 A | * | 10/1998 | Beaman et al. | 250/239 |
| 5,940,127 A | * | 8/1999 | Nakajima | 348/342 |
| 6,531,334 B2 | * | 3/2003 | Sasano | 438/64 |
| 6,564,018 B2 | * | 5/2003 | Melman et al. | 396/429 |

FOREIGN PATENT DOCUMENTS

| | | | | |
|---|---|---|---|---|
| JP | 5266449 | | 3/1982 | |
| JP | 59011084 A | * | 1/1984 | ............ H04N 9/04 |
| JP | 06317765 A | * | 11/1994 | .......... G02B 27/46 |
| JP | 7209610 | | 8/1995 | |
| JP | 8201729 | | 8/1996 | |

OTHER PUBLICATIONS

Grant R. Fowles, Introduction to Modern Optics, 1975, Dover, Second Edition, pp. 169.*

* cited by examiner

Primary Examiner—Thai Tran
Assistant Examiner—Justin Misleh
(74) Attorney, Agent, or Firm—Birch, Stewart, Kolasch & Birch, LLP

(57) ABSTRACT

An artificial crystal double refraction plate is attached to the top of a package having a solid state imaging device chip. The artificial crystal double refraction plate protects an imaging surface and has an optical low-pass effect. An IR cut coating is applied on the surface of the artificial double refraction plate. Another two artificial crystal double refraction plates are arranged separately from the artificial crystal double refraction plate attached to the package. These three artificial crystal double refraction plates achieve desired optical low-pass effects in horizontal and vertical directions.

12 Claims, 11 Drawing Sheets

F I G. 1 0
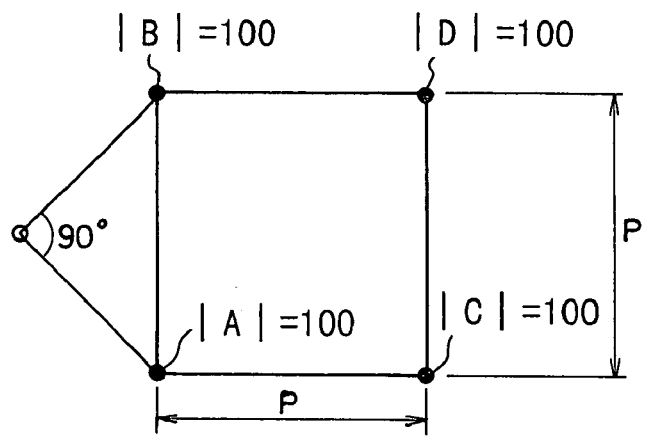
F I G. 1 1
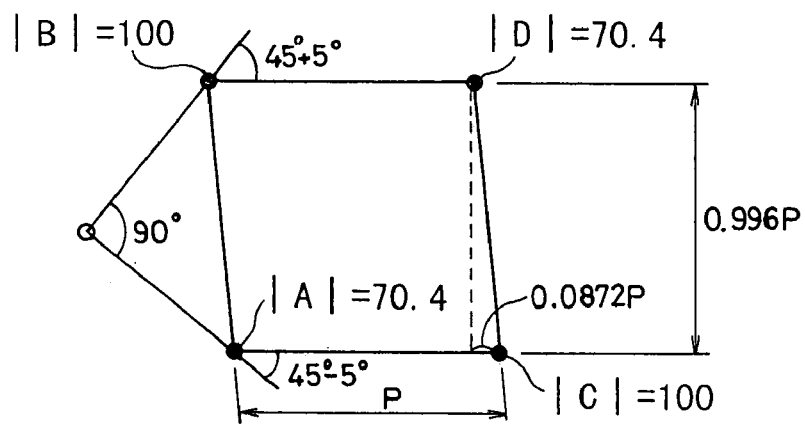
F I G. 1 2
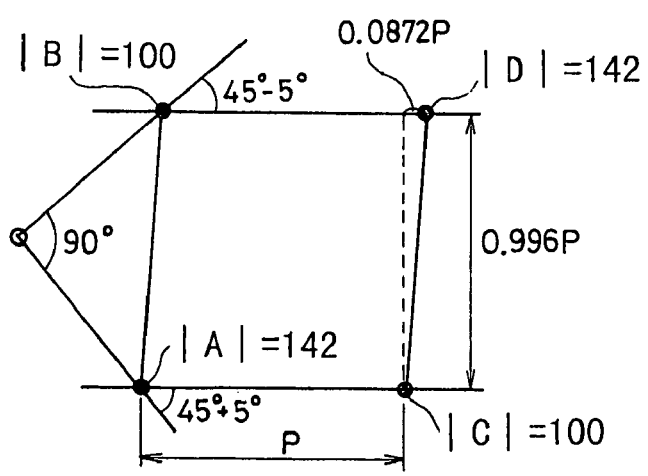

SOLID STATE IMAGING DEVICE FOR REDUCING CAMERA SIZE

BACKGROUND OF THE INVENTION

1. Field of the Invention

The present invention relates generally to a solid state imaging device, and more particularly to a solid state imaging device that reduces the size of a camera, e.g., a video camera and an electronic still camera.

2. Description of Related Art

In a solid state imaging device, an incident light image is sampled by sensors, which are arranged at regular intervals in vertical and horizontal directions. Thus, the maximum resolvable space frequency is ½ of the sampling space frequency determined by the arrangement of the sensors, in other words, the Nyquist frequency. If the incident light image includes higher space frequencies than the Nyquist frequency, the incident light image is turned in a pass band to produce an alias or the moire effect.

The solid state imaging device removes the high frequencies by an optical low-pass filter before sampling the incident light image.

FIGS. 19–23 show a conventional solid state imaging device provided with optical low-pass filters made of double refraction substances such as crystal and calcite.

In FIG. 19, reference numeral 1 is a solid state imaging device, in which a cover glass 4 is attached to the top of a package 3 with a solid state imaging device chip 2. Reference numeral 5 indicates a lead.

Reference numeral 6 indicates an optical low-pass filter made of artificial crystal, and an infrared (IR) cut coating 7 is applied on the surface of the optical low-pass filter 6.

The solid state imaging device 1 in FIGS. 20–23 is the same as in FIG. 19, and they are different in the optical low-pass filter and the like.

More specifically, an optical low-pass filter 8 in FIG. 20 is composed of two artificial crystal double refraction plates 8A, 8B, which are attached to one another. The IR cut coating 7 is applied on the surface of the optical low-pass filter 8. An optical low-pass filter 9 in FIG. 21 is composed of two artificial crystal double refraction plates 9A, 9B and an IR cut filter 17, which is sandwiched between the two artificial crystal double refraction plates 9A, 9B. An optical low-pass filter 11 in FIG. 22 is composed of three artificial crystal double refraction plates 11A, 11B, 11C, which are attached to one another. The IR cut coating 7 is applied on the surface of the optical low-pass filter 11. An optical low-pass filter 12 in FIG. 23 is composed of an artificial crystal double refraction plate 12A, the IR cut filter 17, an artificial crystal λ/4 plate 12B and an artificial crystal double refraction plate 12C, which are attached to one another.

The optical low-pass filter 11 in FIG. 22 is composed of the three crystal double refraction plates 11A, 11B, 11C so that a dot image can be split vertically, horizontally and diagonally. Japanese Patent Publication No. 57-15369 describes the optical low-pass filter 11 in detail.

On the other hand, Japanese Patent Provisional Publication Nos. 8-201729 and 7-209610 disclose phase-type optical low-pass filters with diffraction gratings on the surfaces thereof instead of the optical low-pass filters made of the double refraction substance.

In the phase-type optical low-pass filter in Japanese Patent Provisional publication No. 8-201729, a diffraction grating having an optical low-pass effect is formed on the surface of a resin IR cut filter. In the phase-type optical low-pass filter in Japanese Patent Provisional Publication No. 7-209610, a diffraction grating having an optical low-pass effect is formed on a transparent resin, which covers a solid state imaging device chip.

The phase-type optical low-pass filters are thin but the cut-off values thereof depend on the wavelength. In addition, the shades of the grating patterns appear on the screen and this deteriorates blurred images. Thus, the phase-type optical low-pass filters are not suitable for video cameras, electronic still cameras and the like having a high image quality.

On the other hand, an artificial crystal optical low-pass filter is used in order to achieve the high image quality as shown in FIGS. 19–23. The thickness of the crystal optical low-pass filter and the cover glass of the solid state imaging device account for 10–20% of the total length of the taking lens system as the camera has recently become smaller.

SUMMARY OF THE INVENTION

In view of the foregoing, it is an object of the present invention to provide a solid state imaging device, in which an optical low-pass filter made of a double refraction substance is arranged efficiently to reduce the size of the camera.

To achieve the above-mentioned object, the present invention is directed to a solid state imaging device in which a transparent cover member for protecting an imaging surface is attached to the top of a package with a solid state imaging device chip, wherein an optical low-pass filter, made of a double refraction substance, is used as the transparent cover member. This can eliminate a conventional cover glass, which is provided only for the purpose of protecting the imaging surface, and shorten the back focus of the taking lens to reduce the size of a camera as a whole. An infrared cut coating is applied on the surface of the optical low-pass filter. Moreover, the infrared cut coating is applied to an area of the optical low-pass filter, except for an area which is attached to the package. The optical low-pass filter is ultraviolet-adhered to the package in many cases, and if the infrared cut coating is applied on the whole surface of the optical low-pass filter, the infrared cut coating cuts the frequency required for the ultraviolet adhesion.

The present invention is also directed to a solid state imaging device in which a transparent cover member for protecting an imaging surface is attached to the top of a package with a solid state imaging device chip, device wherein an optical low-pass filter, composed of multiple double refraction plates, is separated into two or more, and one of the multiple double refraction plates is used as the transparent cover member. An infrared cut coating is applied on the surface of one of the multiple double refraction plates separated from the optical low-pass filter.

The present invention is also directed to a solid state imaging device in which a transparent cover member for protecting an imaging surface is attached to the top of a package with a solid state imaging device chip, wherein an optical low-pass filter, composed of multiple double refraction plates and an infrared cut filter, is separated into two or more, and one of the multiple double refraction plates or the infrared cut filter is used as the transparent cover member.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 10 is a view showing a split state of dot images and relative intensities in the case that there is no angular displacement between the two separated artificial crystal double refraction plates and the one artificial crystal double refraction plate in FIG. 6;

FIG. 11 is a view showing a split state of dot images and the relative intensities in the case that the two separated artificial crystal double reflection plates are rotated counterclockwise at an angle of 5° with respect to the one artificial crystal double refraction plate in FIG. 6;

FIG. 12 is a view showing a split state of dot images and relative intensities in the case that the two separated artificial crystal double reflection plates are rotated clockwise at an angle of 5° with respect to the one artificial crystal double refraction plate in FIG. 6;

DETAILED DESCRIPTION OF THE PREFERRED EMBODIMENT

This invention will be described in further detail by way of example with reference to the accompanying drawings.

FIGS. 1–5 show the first through fifth embodiments of a solid state imaging device according to the present invention.

The solid state imaging devices of the first through fifth embodiments are equivalent to a conventional solid state imaging device 1 shown in FIGS. 19–23. In the solid state imaging devices of the present invention, optical low-pass filters and the like are efficiently arranged instead of the cover glass 4.

Figure 1:
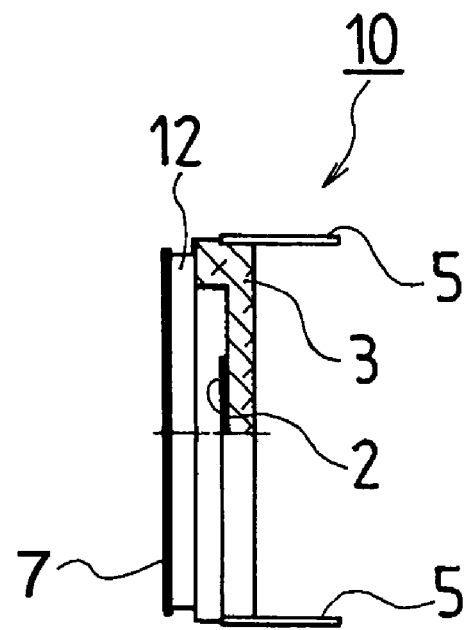
FIG. 1 is a view showing a first embodiment of a solid state imaging device according to the present invention.

More specifically, a solid state imaging device 10 in FIG. 1 comprises a solid state imaging device chip 2, a package 3 composed of a ceramic plate, etc. with a lead 5, and an optical low-pass filter 12 made of a double refraction substance (an artificial crystal) whose surface is coated with an IR cut coating 7 composed of multilayer film. The solid state imaging device chip 2 is attached to the package 3 and is bonded to the lead 5 through a wire. The optical lowpass filter 12 is adhered to the top of the package 3.

The optical low-pass filter 12 uses the property of the double refraction substance (crystal) which separates an incident light into a normal light and an abnormal light. The width of separation corresponds to a cut-off frequency, so that the optical low-pass filter 12 can produce an optical low-pass effect. The optical low-pass filter 12, which is attached to the top of the package 3, functions as a transparent cover member that protects an imaging surface.

Figure 2:
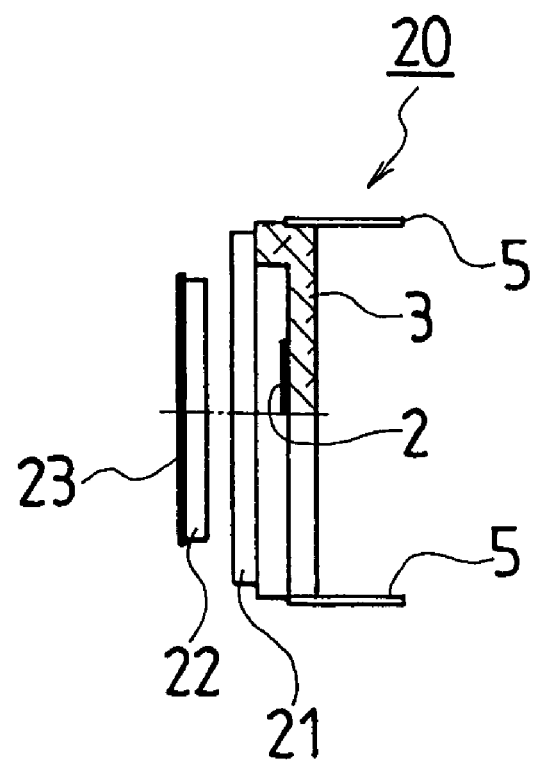
FIG. 2 is a view showing a second embodiment of the solid state imaging device according to the present invention.

A solid state imaging device 20 in FIG. 2 is constructed in such a manner that the optical low-pass filter composed of two artificial crystal double refraction plates 21, 22 are separated and one artificial crystal double refraction plate 21 is attached to the top of the package 3. The other structure is same as that of the solid state imaging device 10. The other artificial double refraction plate 22 is arranged in front of the artificial crystal double refraction plate 21, and the surface of the artificial double reflection plate 22 is coated with the IR cut coating 23.

Figure 3:
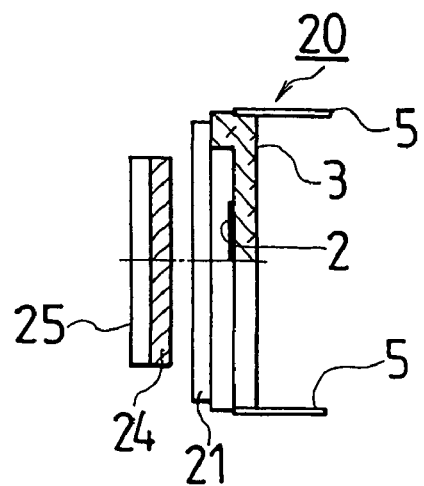
FIG. 3 is a view showing a third embodiment of the solid state imaging device according to the present invention.

The solid state imaging device 20 in FIG. 3 is constructed in such a manner that an optical low-pass filter, composed of two artificial crystal double refraction plates 21, 25 and an IR cut filter (cyan filter) 24 sandwiched between the artificial crystal double refraction plates 21, 25, is separated and one separated artificial crystal double refraction plate 21 is attached to the top of the package 3.

Figure 4:
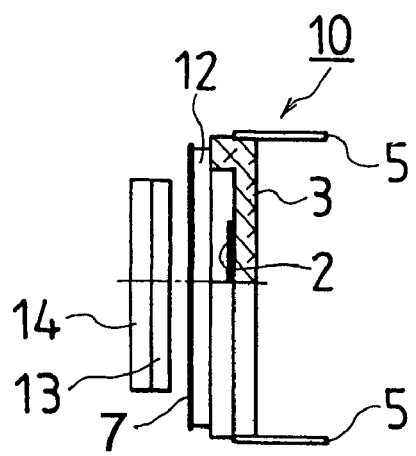
FIG. 4 is a view showing a fourth embodiment of the solid state imaging device according to the present invention.

The solid state imaging device 10 in FIG. 4 is constructed in such a manner than an optical low-pass filter, which is composed of three artificial crystal double refraction plates 12, 13, 14, is separated and one artificial crystal double refraction plate 12 is attached to the top of the package 3. The surface of the artificial crystal double refraction plate 12 is coated with the IR coating 7.

The solid state imaging device 10 in FIG. 4 has the same structure as in FIG. 1, and the separated artificial crystal double refraction plates 13, 14 are arranged in front of the artificial crystal double refraction plate 12.

Figure 5:
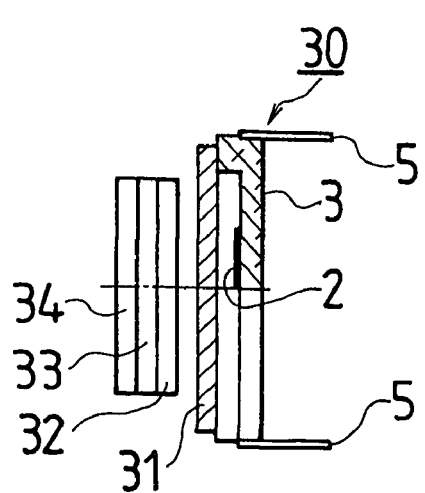
FIG. 5 is a view showing a fifth embodiment of the solid state imaging device according to the present invention.

The solid state imaging device 30 in FIG. 5 is constructed in such a manner that an optical low-pass filter composed of an IR cut filter 31, an artificial crystal double refraction plate 32, an artificial crystal λ/4 plate 33 and an artificial crystal double refraction plate 34 is separated and the IR cut filter 31 is attached to the top of the package 3. The separated artificial crystal double refraction plate 32, the artificial crystal λ/4 plate 33 and the artificial crystal double refraction plate 34 are arranged in front of the IR cut filter 31.

Figure 6:
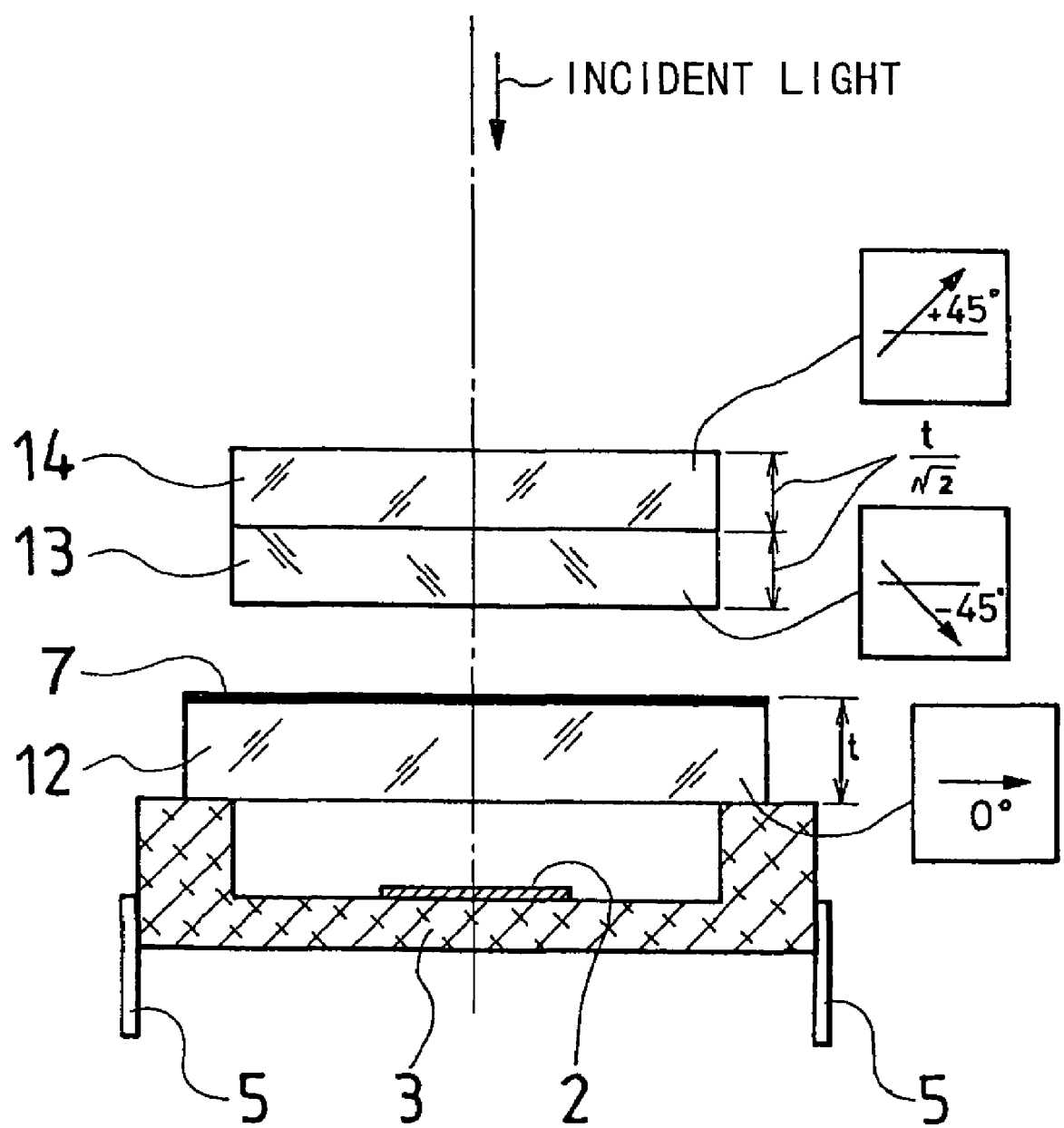
FIG. 6 is an enlarged view showing the details of the solid state imaging device and the like in FIG. 4.

FIG. 6 is an enlarged view showing the solid state imaging device 10 in FIG. 4 or the like. The artificial crystal double refraction plate 12 has such a thickness (t) as to obtain a desired separation width in a horizontal or vertical direction. The artificial crystal double refraction plates 13, 14 have a thickness (t/√2). In FIG. 6, arrows indicate the directions of the optical axes, along which the incident light is separated at the artificial crystal double refraction plates. 12, 13, 14.

Figures 7A, 7B, 7C:
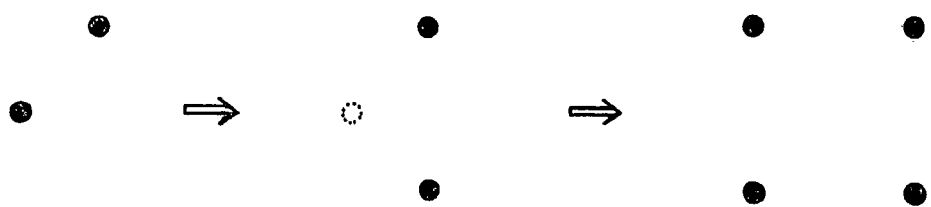
FIGS. 7(A), 7(B) and 7(C) are views showing the state wherein three artificial crystal double refraction plates in FIG. 6 split dot images.

FIG. 7 shows the state wherein a dot image is separated at the artificial crystal double refraction plates 12, 13, 14. One dot image passes through the first artificial crystal double refraction plate 14 to become dot images as shown in FIG. 7(A), then the dot images pass through the second artificial crystal double refraction plate 13 to become dot images as shown in FIG. 7(B), and then the dot images pass through the third artificial crystal double refraction plate 12 to become dot images as shown in FIG. 7(C). More specifically, the dot image passes through three artificial crystal double refraction plates 12, 13, 14 to thereby obtain the separated dot images (four dot images forming a square) with uniform intensity.

A description will now be given of the changes in frequency characteristics, which results in the angular displacement between the optical axis of the separated artificial crystal double refraction plate 12, which is attached to the top of the package 3, and the optical axes of the artificial double refraction plates 13, 14.

Figure 13:
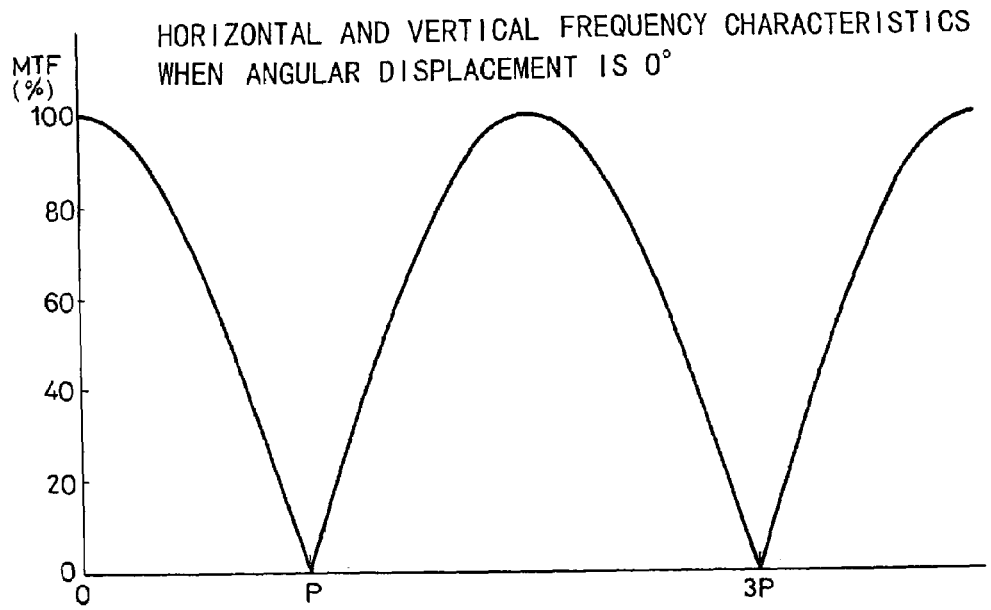
FIG. 13 is a view showing the frequency characteristics in horizontal and vertical directions in the case of FIG. 10.

FIG. 10 shows the state of the separated dot images with a normalized separation width P when the angular divergence is 0°, and the relative intensities when |C|=100. In this case, the separated dot images form a square with uniform intensity. FIG. 13 shows the frequency characteristics in the horizontal and vertical directions in this case.

Figure 8:
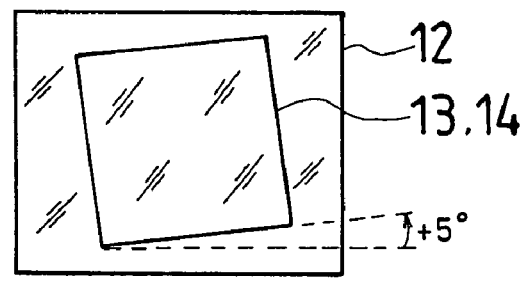
FIG. 8 is a view showing the state wherein two separated artificial crystal double reflection plates are rotated counterclockwise at an angle of 5°, seen from an incident side, with respect to one artificial crystal double refraction plate in FIG. 6.
Figure 9:
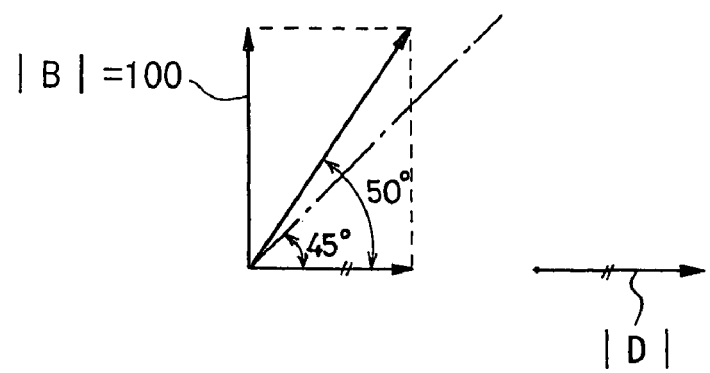
FIG. 9 is a view to assist in explaining how to calculate the intensities of the dot images in the case that the two artificial crystal double reflection plates in FIG. 6 are rotated counterclockwise at an angle of 5°.

FIG. 11 shows the state of the separated dot images when the two separated artificial crystal double refraction plates 13, 14 are rotated counterclockwise, seen from the incident side, by 5° with respect to the artificial crystal double refraction plate 12 as shown in FIG. 8, and the relative intensities when [C]=100. FIG. 9 is a view to assist in explaining how to calculate the intensities of the dot images in the case that the two artificial crystal double reflection plates in FIG. 6 are rotated counterclockwise at an angle of 5°.

As shown in FIG. 11, the four separated dot images are located at the apexes of a parallelogram, and the separation width in the horizontal direction is P and the separation width in the vertical direction is 0.996P (≈cos 5°×P). The horizontal displacement of the upper and lower dot images is 0.0872P (≈sin 5°×P).

On the other hand, if |B|=|C|=100, the intensities of |A| and |D| are proportional to the square of an amplitude, and thus, they can be expressed by the following equations:

$$|A|=|C| \times sin^2\, 40°/sin^2\, 50° \approx 70.4;$$

$$[D]-[C] \times cos^2\, 50°/cos^2 =70.4.$$

Figure 14:
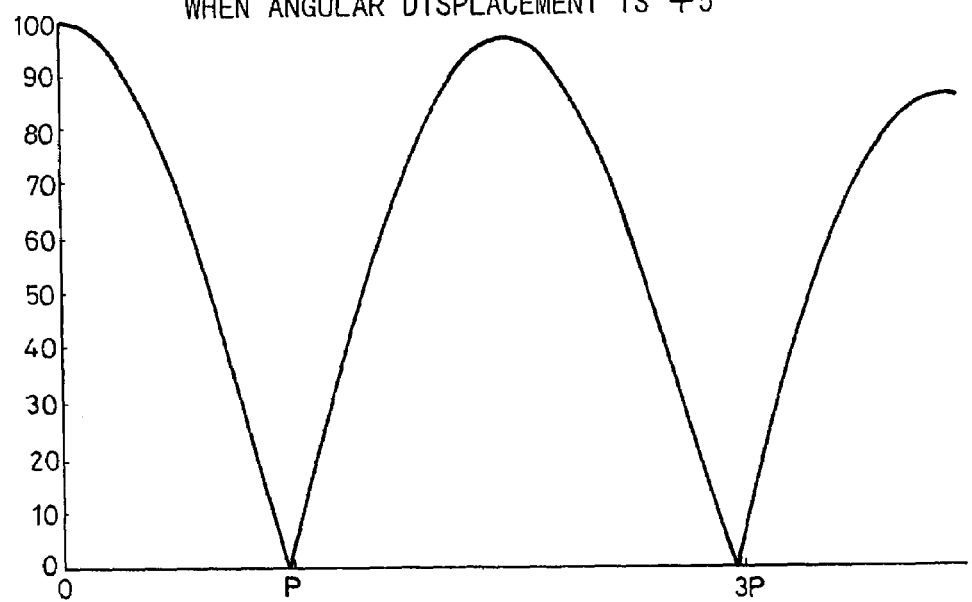
FIG. 14 is a view showing the frequency characteristics in a horizontal direction in the case of FIG. 11.
Figure 16:
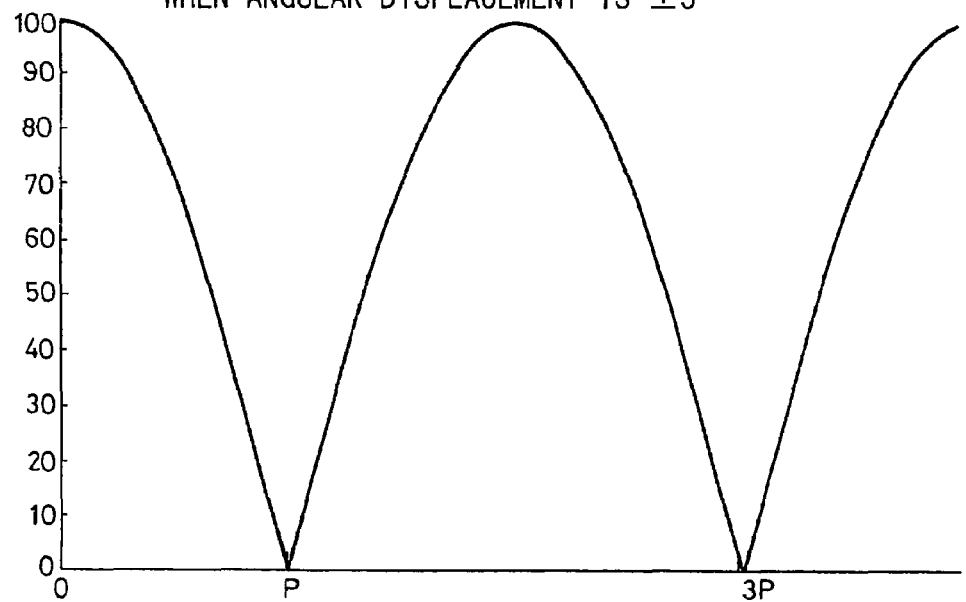
FIG. 16 is a view showing the frequency characteristics in a vertical direction in the case of FIGS. 11 and 12.

FIGS. 14 and 16 show the frequency characteristics in the horizontal and vertical directions, respectively.

FIG. 12 shows the state of the separated dot images when the two separated artificial crystal double refraction plates 13, 14 are rotated clockwise, seen from the incident side, by 5° with respect to the artificial crystal double refraction plate 12, and the relative intensities when |C|=100.

As shown in FIG. 12, the positional relation between the four separated dot images is same as that in FIG. 11, except that the displacement of the upper and lower dot images in the horizontal direction is reverse.

On the other hand, if |B|=|C|=100, the intensities of |A| and |D| can be expressed by the following equations:

$$[A]=[C] \times sin^2\, 50°/sin^2\, 40°=142;$$

$$|D|=|C| \times cos^2\, 40°/cos^2\, 50° \approx 142.$$

Figure 15:
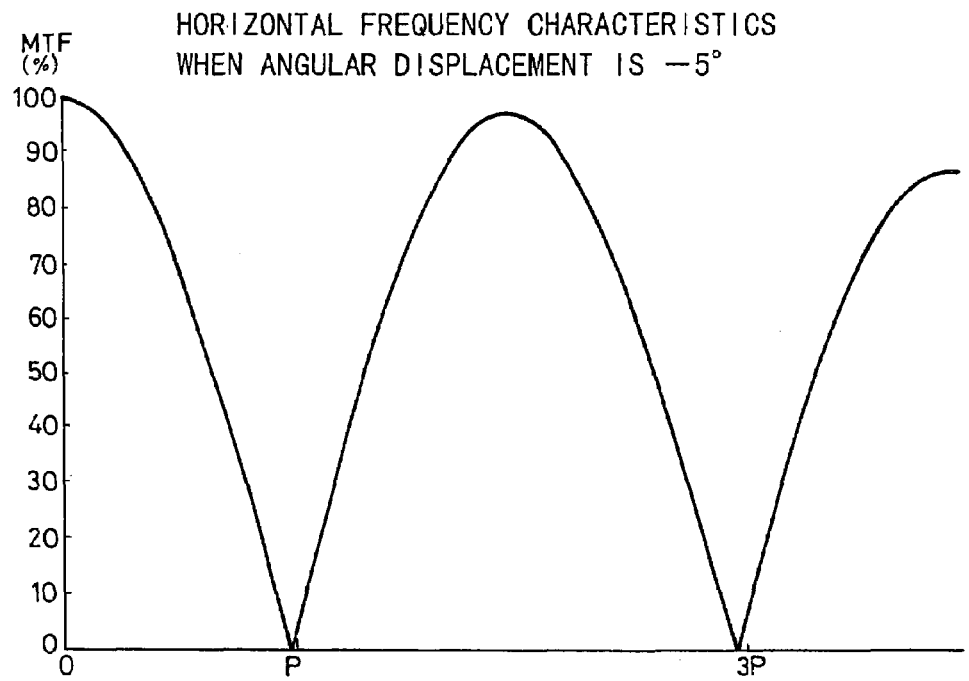
FIG. 15 is a view showing the frequency characteristics in a horizontal direction in the case of FIG. 12.

FIGS. 15 and 16 show the frequency characteristics in the horizontal and vertical directions, respectively.

Consequently, if the two separated artificial crystal double refraction plates 13, 14 are rotated by ±5° with respect to the artificial crystal double refraction plate 12, the difference of the cut-off value is only several % and the other responses hardly change. Even if the relative displacement between the solid state imaging device chip 2 and the package 3, the displacement between the package 3 and the optical axis of the artificial crystal double refraction plate 12 attached to the package 3, the displacement between the package 3 and the optical axes of the two artificial crystal double refraction plates 13, 14, and the like are added, the mechanical displacement amount will never exceed 5°. Therefore, the optical low-pass filter has the satisfactory characteristics even if artificial crystal double refraction plates of the optical low-pass filter are separated.

Figures 17A, 17B:
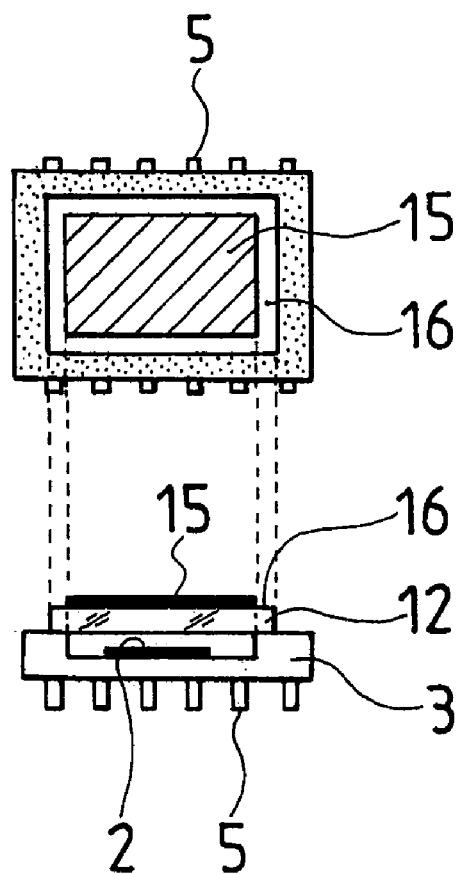
FIGS. 17(A) and 17(B) are views to assist in explaining an area where an IR cut coating is applied.

FIGS. 17(A) and 17(B) show the sixth embodiment of the solid state imaging device according to the present invention. Particularly if the sixth embodiment is compared with the first embodiment shown in FIG. 1, they are different only in areas where the IR cut coating 15 is applied. In FIGS. 17(A) and 17(B), parts similar to those described with reference to FIG. 1 are denoted by the same reference numerals, and they will not be described.

The IR cut coating 15 in FIGS. 17(A) and 17(B) is not applied on the whole surface of the optical low-pass filter 12, but it is applied to an area except for an area 16, which is adhered to the package 3.

The optical low-pass filter 12 is ultraviolet-adhered to the package 3 in many cases. If the IR cut coating 15 is applied on the whole surface of the optical low-pass filter 12, the optical low-pass filter 12 cannot be ultraviolet-adhered to the package 3 satisfactorily. To address this problem, the IR cut coating 15 is not applied on the area 16.

Figure 18:
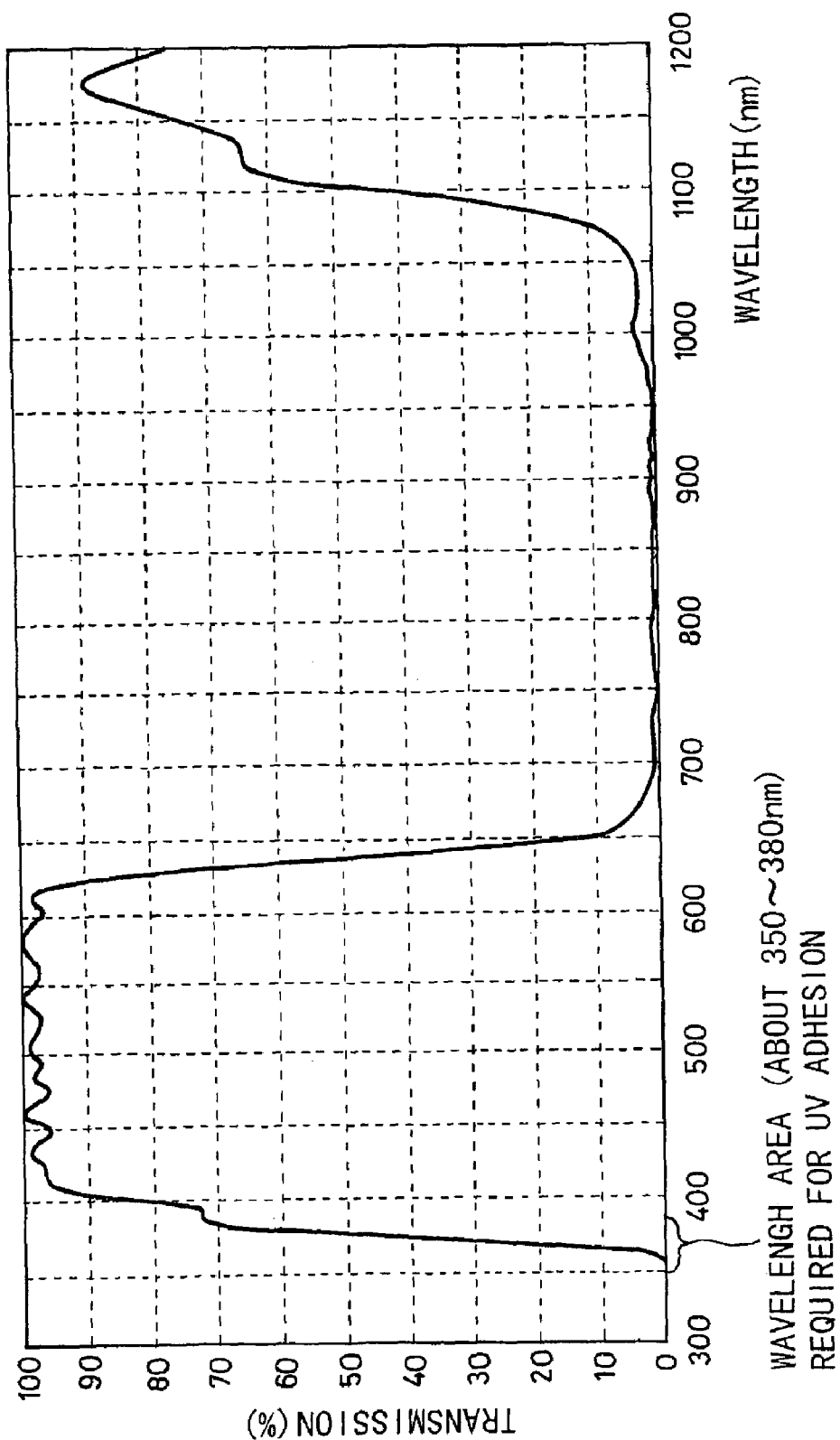
FIG. 18 is a view showing the characteristics of a typical IR cut coating.
Figure 19:
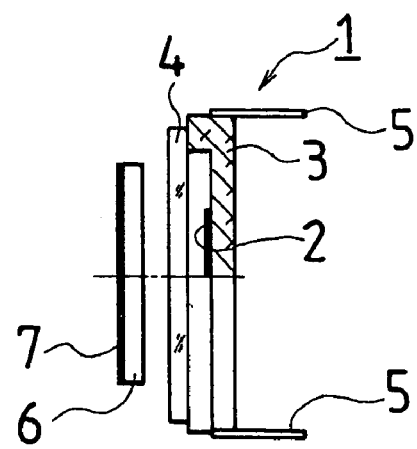
FIG. 19 is a view showing the first example of a conventional solid state imaging device.
Figure 20:
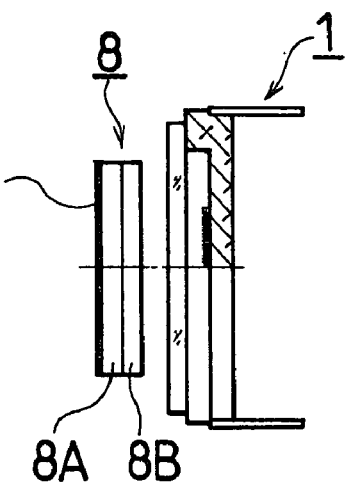
FIG. 20 is a view showing the second example of the conventional solid state imaging device.
Figure 21:
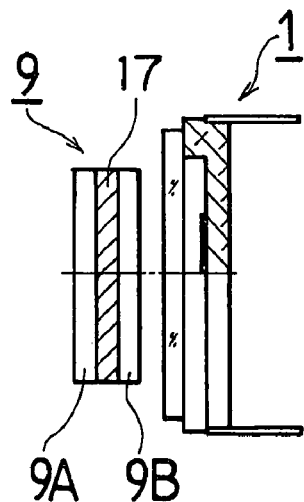
FIG. 21 is a view showing the third example of the conventional solid state imaging device.
Figure 22:
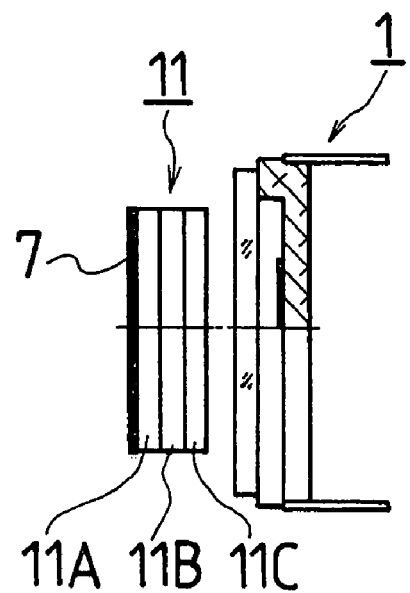
FIG. 22 is a view showing the fourth example of the conventional solid state imaging device.
Figure 23:
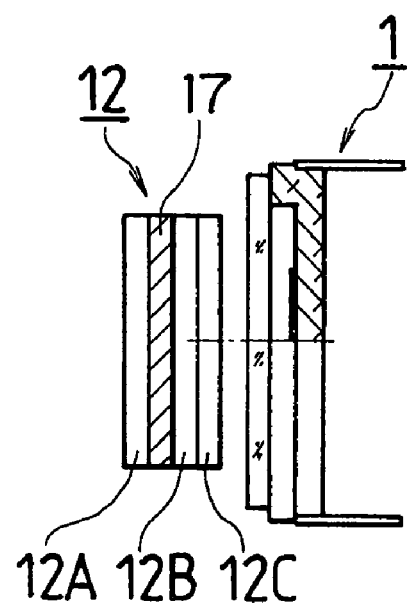
FIG. 23 is a view showing the fifth example of the conventional solid state imaging device.

FIG. 18 shows the characteristics of a typical IR cut coating. As shown in FIG. 18, the IR cut coating cuts the frequency with a wavelength (about 350–380 nm) required for the ultraviolet adhesion. In the embodiment shown in FIGS. 17(A) and 17(B), the IR cut coating is not applied on the area 16 attached to the package 3 so that the optical low-pass filter 12 can be ultraviolet-adhered to the package 3 satisfactorily.

According to the solid state imaging device of the present invention, the optical low-pass filter made of the double refraction substance is arranged efficiently without providing the cover glass attached to the conventional package. This shortens the back focus of the taking lens and reduces the size of the camera.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A solid state imaging device, in which a transparent cover member for protecting an imaging surface is attached to a top of a package with a solid state imaging device chip, wherein
   an optical low-pass filter, made of a double refraction substance, is used as said transparent cover member,
   an infrared cut coating is applied on a surface of said optical low-pass filter, and
   said infrared cut coating is applied to an area of said optical low-pass filter, except for an area which is attached to said package, said optical low-pass filter being ultraviolet-adhered to the package.

2. A solid state imaging device in which a transparent cover member for protecting an imaging surface is attached to a top of a package with a solid state imaging device chip, wherein an optical low-pass filter, composed of multiple double refraction plates such that an unfilled gap exists between at least two double refraction plates, and one of said multiple double refraction plates is used as said transparent cover member.

3. The solid state imaging device as defined in claim 2, wherein an infrared cut coating is applied on a surface of one multiple double refraction plate separated from other multiple double refraction plate or plates of said optical low-pass filter.

4. A solid state imaging device in which a transparent cover member for protecting an imaging surface is attached to a top of a package with a solid state imaging device chip, wherein an optical low-pass filter, composed of multiple double refraction plates and an infrared cut filter such that an unfilled gap exists between at least two double refraction plates, and one of said multiple double refraction plates or said infrared cut filter is used as said transparent cover member.

5. A solid state imaging device, comprising:
   a package;
   a solid state imaging device chip within said package;
   a first double refraction plate physically covering said package and said solid state imaging device chip;
   second and third double refraction plates formed above said first double refraction plate and said infrared cut coating, wherein said second and third double refraction plates physically touch each other, and wherein said second and third double refraction plates are physically apart from said first double refraction plate and said infrared cut coating; and
   said infrared cut coating applied on a surface of said double refraction plate opposite of a surface of said double refraction plate covering said package and said solid state imaging device chip.

6. The solid state imaging device of claim 5, wherein the first double refraction plate has a predetermined thickness t and the second and third double refraction plates each has a thickness substantially equal to $$\frac{t}{\sqrt{2}}.$$

7. A solid state imaging device, comprising:
   a package;
   a solid state imaging device chip within said package;
   a first double refraction plate physically covering said package and said solid state imaging device chip; and
   a second double refraction plate formed above and physically apart from said first double refraction plate such that an unfilled gap exists between said first and second double refractions plates.

8. The solid state imaging device of claim 7, further comprising an infrared cut filter physically touching said second double refraction plate and apart from said first double refraction plate.

9. The solid state imaging device of claim 8, wherein said infrared cut filter is formed in between said first and second double refraction plates.

10. The solid state imaging device of claim 7, further comprising an infrared cut coating applied to a surface of said second double refraction plate.

11. The solid state imaging device of claim 10, wherein the surface of said second double refraction plate on which said infrared cut coating applied is opposite of a surface near to said first double refraction plate.

12. A solid state imaging device, comprising:
   a package;
   a solid state imaging device chip within said package;
   an infrared cut filter plate physically covering said package and said solid state imaging device chip; and
   an optical low-pass filter formed above and physically apart from said infrared cut filter such that an unfilled gap exists between said infrared cut filter plate and said optical low-pass filter.

* * * * *